United States Patent
Kohlas

[11] 3,931,502
[45] Jan. 6, 1976

[54] METHOD AND APPARATUS FOR LOCALIZATION OF FAILURES ON ELECTRICAL LINES

[75] Inventor: Jürg Kohlas, Fribourg, Switzerland

[73] Assignee: BBC Brown Boveri & Company Ltd., Baden, Switzerland

[22] Filed: Jan. 21, 1974

[21] Appl. No.: 434,790

[30] Foreign Application Priority Data
Jan. 31, 1973 Switzerland.................... 1386/73

[52] U.S. Cl. ............ 235/151.31; 317/36 D; 324/52
[51] Int. Cl. ..................... G01r 31/08; G06f 15/20
[58] Field of Search........ 235/151.31; 317/29 R, 31, 317/36 D, 36 TD; 324/51, 52

[56] References Cited
UNITED STATES PATENTS

| | | | |
|---|---|---|---|
| 3,277,343 | 10/1966 | Seeley................. | 317/29 R |
| 3,590,368 | 6/1971 | Esclangon............ | 324/51 |
| 3,612,989 | 10/1971 | Souillard et al...... | 324/52 |
| 3,723,864 | 3/1973 | Ricard.................. | 317/36 D X |
| 3,735,204 | 5/1973 | Maenicke............. | 317/36 D X |
| 3,800,215 | 3/1974 | Souillard.............. | 317/36 D X |

Primary Examiner—Malcolm A. Morrison
Assistant Examiner—Jerry Smith
Attorney, Agent, or Firm—Flynn & Frishauf

[57] ABSTRACT

At a measuring point serving at least one adjacent line segment instantaneous values of current and voltage are measured in sequential pairs, either continuously or at intervals by delaying these values by discrete amounts of delay corresponding to twice the wave propagation time on the line from the measuring point to a number of selected reference (appraisal) points along the line segment, and then combining the delayed value pairs corresponding to each appraisal point with a real time value pair. A voltage value at each appraisal point at the mid-point of the delay period is determined by use of delayed measured values that take account of line propagation characteristics such as damping. In one form of processing, the appraisal point voltage thus obtained is then squared or otherwise processed to provide a unimodal function, and then further processed by an average function generator to yield an evaluation function for the appraisal point which can effectively be compared with one or more limit values for control of warning and cut-off devices designed to be activated in case of a failure. In a second form of processing, the gradients of the appraisal point voltage at the two ends of the line segment in question are continually or sequentially calculated and their respective signs are compared in such a way as to activate warning and cut-out systems when the presence of a voltage minimum within the line segment is detected. The system operates without circuits of the kind that require measured voltages and currents to be resolved into sinusoidal components or proper evaluation of transients.

26 Claims, 11 Drawing Figures

METHOD AND APPARATUS FOR LOCALIZATION OF FAILURES ON ELECTRICAL LINES

This invention relates to a method and apparatus for delimiting the location of a failure on electrical lines and, more particularly, methods and apparatus for that purpose in which at least one line segment is monitored at a measurement point by measuring current and voltage values, which are analyzed or processed to detect a failure on the line segment being monitored and to set off a failure signal when a failure is detected.

The most common cause of failure to which electrical lines are subjected, particularly high voltage lines for long-distance power transmission in the open, is a drop of the shunt resistance, particularly the insulation resistance, below the lowest permissible value, a condition that is in general produced by a short-circuit between two of the line conductors or between one or more of them and ground. Continuous monitoring is necessary to deal with failures so caused, in order to make possible suitable and prompt switching operations for prevention of grave disturbances of connected installations and damage or destruction in the transmission system itself.

In order to switch out a line segment stricken by failure and likewise to switch out a line segment for repair in case of continuing insulation faults and the like, it is necessary or at least desired to delimit and confine the place of failure entirely to the stricken segment, the identity of which is initially still unknown and usually to provide, in addition, a more or less exact localization of the place of failure within the line segment.

The function just described is fulfilled in conventional practice by a remote protection system based on the use of a line simulation network utilizing lumped impedances connected with measuring and measurement responsive apparatus, the latter including remote control relays or the like, which in general are connected at the ends or junctions of individual line segments to be protected. The mode of operation of known methods and apparatus for remote control protection of alternating current transmission (which is the principal field of application for this type of protection) is essentially based on an analysis or approximation of the behavior of the momentary values of currents and voltages when a disturbance is present, the analysis or approximation being in terms of sinusoidal components, since the latter lend themselves readily to working with networks of postulated impedances.

An important disadvantage of the conventional remote control protection arises from the fact that the behavior of current and voltage in the decisive first phase of the disturbing event is mainly determined by nonsinusoidal transient effects, which requires taking account of strong harmonic components and application of correspondingly complicated and expensive evaluation and approximation methods with corresponding filter networks. In spite of the high circuit expense, the accuracy and reliability of failure localization and the speed of decision, or the time requirements, for automatic evaluation of the measurements up to the point where a suitable switching criterion can be applied, are in great need of improvement.

It is accordingly an object of the present invention to provide a method and apparatus by which a quick and reliable delimitation of the place of failure in a transmission line can be accomplished by reference to the behavior of momentary values of current and voltage at a measurement location, preferably at only one single place of measurement, without resolving the observed data into sinusoidal components.

Subject Matter of the Present Invention

Briefly, a method and apparatus is based upon the recognition that the time variation of the momentary values of current and voltage at a place of measurement where the transients resulting from the occurrence of a fault are observable do contain sufficient information for delimiting the place of failure, to the extent that certain minimum conditions are observed with respect to the time over which measurements are determined. At least one and generally two or more reference locations, hereinafter referred to as "appraisal points" are taken for each line segment to be monitored from a given measuring point. Current and voltage simultaneously observed at the measuring point are determined, each determination hereinafter being referred to as a "value pair", and the measurement is continued, with reference to each appraisal point, over a time interval equal to at least twice the wave propagation period on the line between the measuring point and the appraisal point. Measured value pairs and the values derived therefrom are stored for each appraisal point, and likewise for such a time interval, so that for each appraisal point a set of two value pairs having a relative time displacement, between pairs of a set, equal to twice the aforesaid wave propagation time can then be used to compute a decision function which may be referred to as an evaluation function. For this purpose the value pairs of a time-displaced set are used to produce by time averaging a unimodal function of the voltage at the appraisal point in question, and the comparison of the evaluation function so obtained is compared with at least one reference value in order to determine whether a failure signal should be produced.

For carrying out this method, current and voltage measuring means are connected to the line segment being monitored at the measuring point, which may conveniently be one end of the segment, and the values measured thereby are provided to information processing means, including means for performing the storage above referred to and computing means for combining with each other current and voltage value pairs mutually time-displaced by twice the wave propagation period on the line segment between the measuring point and the particular appraisal point and computing for each appraisal point, in accordance with the characteristic line equations and by the use of at least one time-averaging operation, an evaluation function of the voltage at the appraisal point dependent on a time sequence of sets of two time-displaced value pairs combined as aforesaid. Finally, the evaluation function for each appraisal point thus obtained is compared with at least one reference value in suitable discriminator means controlling the provision of a failure signal to activate prearranged precautions for reacting to a failure, such as isolating the fault, providing alternate circuits, alerting personnel, etc.

In accordance with the method and apparatus above briefly described, the time period conditions for measurement determination in the method and system are essentially that for every appraisal point chosen for the line a plurality of sets of measured value pairs must be available of which each set consists of two value pairs with a relative time displacement equal to twice the wave propagation time between the measuring point and the appraisal point. Each of these sets of value pairs provides by corresponding evaluation a momentary value of the voltage at the appraisal point, which corresponds to the voltage at the moment equidistant in time between the times at which the two current and voltage value pairs were measured. A failure criterion cannot be derived for application to a momentary voltage at the appraisal point, however, and likewise not from a sequence of two or more momentary voltage values as such, if the disadvantages of the known method, as already described, are to be avoided. Consequently, as outlined briefly above, a function is generated from a time sequence of sets of time-displaced value pairs which is a function held in unimodal dependence on the voltage at the appraisal point, i.e. a function which always has the same sign for whatever sign the successive voltages at the appraisal point may have. For example a squared function, which may be referred to as a quadratic function, or a root function of the voltage at the appraisal point may be used. The aforesaid evaluation function is then generated by at least one averaging operation on this unimodal voltage function. A failure criterion can be provided for such an evaluation function, simply by comparison of the function with at least one reference value. For such a reference value, for example, a fixed predetermined limit value may be used, or else a time-displaced value of the evaluation function itself or, if desired, two or more of such values may be used as reference values, either in AND or OR combination. For example, the criterion can be carried out in the form of a test for a minimum. It is also possible to include the formation of a gradient in the process of generating the evaluation function. In particular, the gradient of a time average of a quadratic voltage function for one or more appraisal points can be formed. For the provision of the failure criterion, there is then available basically, again, comparison of the gradients with a limit value for one or more appraisal points or, on the other hand, a comparison of the signs of the gradients for a plurality of appraisal points, particularly for two appraisal points.

All the above-mentioned evaluation possibilities fall into two groups. The first group is distinguished by the comparison of an evaluation function with one or more fixed limit values. This method utilizes the fact that the time average of a unimodal voltage function, and also the spatial gradient of such an average, does not fall below a certain minimum value for any point of the line, under line conditions undisturbed by fault or failure.

The second group is based on investigation of the spatial variation of the evaluation function, particularly to see whether there is a minimum. Such a minumum of the time average of a unimodal voltage function always occurs at the place of a short circuit or at a place with a relatively persisting voltage reduction. The presence of such a minimum within the line segment being monitored can be determined, for example, by comparison of the evaluation functions of a corresponding multiplicity of appraisal points with each other, or else by observation of the gradient of a time average of the unimodal voltage function, in the latter case, for example, by comparison of the signs of the gradients at appraisal points in the neighborhood of the ends of the line segment. By selecting a sufficiently large number of appraisal points over the lengths of the line segment, the computation can be carried out to show the occurrence of secondary minima or maxima. This last-mentioned complication generally occurs only in relatively long line segments that in practice are of small significance.

The invention will be described by way of example with reference to the accompanying drawings, wherein.

Figure 1:
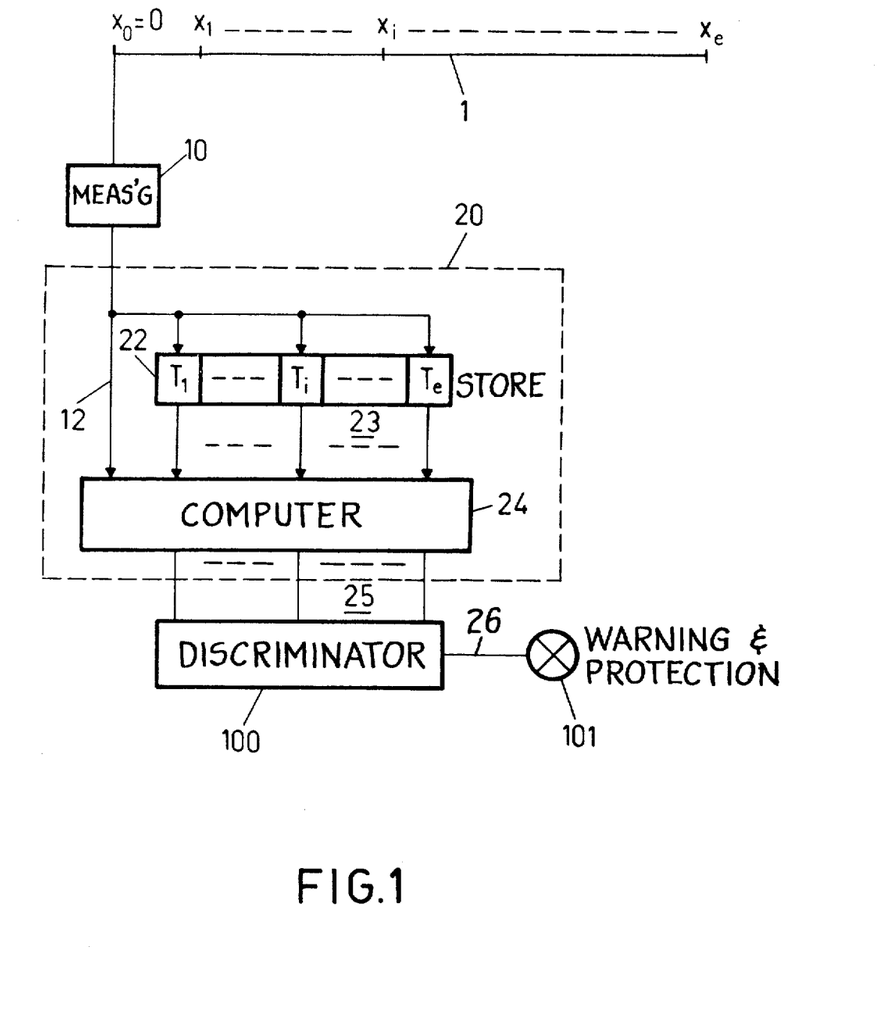
FIG. 1 is a block diagram of the basic circuit of an apparatus for delimiting the location of a failure in accordance with the invention.

FIG. 1 shows a line 1, typically part of an electrical transmission line along the length of which a number of reference points, referred to herein as appraisal points, designated $x_1 \ldots x_i \ldots x_e$ have been selected, the last appraisal point $x_e$ being at the far end of the line. At the beginning end of the line $X_0 = 0$ is connected a measuring means 10 for sequential determination of current-voltage value pairs. The measured value pairs determined by the measuring means 10 are fed — continuously or stepwise in time — to an information processing means 20, which includes a storage device 22 and a computer 24. The measured value pairs are provided directly to the computer 24 over a connection 12 (which may represent multiple connections, of course) and, in parallel thereto, are provided to the computer 24 with a delay provided by the store 22. The individual storage stages or cells of the store 22 respectively have a storage time $T_1 \ldots T_i \ldots T_e$ corresponding to the respective appraisal points $x_1 \ldots x_i \ldots x_e$ and the differently delayed outputs of these cells appears on the respective conductors of a multiplicity of transmission channels collectively designated as the multiple 23, which leads these outputs to the computer 24. The output of the computer 24, which constitutes the output of the information processor 20 is brought out on another channel multiple 25 of which the individual channels, as in the case of the channel multiple 23, relate to the respective predetermined appraisal points. The channel multiple 25 connects the output of the information processor 20 to a discriminator 100 for translating the computed information into a switching operation that activates warning and protection apparatus 101 when a failure is found. The apparatus 101 is shown symbolically in a form that is to be regarded as representing the conventional switching arrangements of a transmission line protection system.

The processing operation of such an apparatus is based on the fact that a magnitude $v(x_i, t)$ reproducing the momentary values of the line voltage $u(x_i, t)$, as subject to an exponential damping factor $e^{-\beta x_i/d}$ and with a time-displacement corresponding to the single wave propagation period between measuring point and evaluation point, can be calculated by the following equation:

$$v(x_i, t) = r(t) + e^{-\beta_i x \cdot i x} \cdot s(t-T_i) \quad (1)$$

with the help of the auxiliary functions:

$$r(t) = \tfrac{1}{2} u_o(t) - \tfrac{1}{2} x \cdot i_o(t) \quad (2)$$
$$s(t) = \tfrac{1}{2} u_o(t) + \tfrac{1}{2} x \cdot i_o(t) \quad (3)$$

referring respectively to the actual (real) time and to a time in the past displaced by twice the wave propagation time on the line between measuring point and appraisal point. The partial functions $r(t)$ and $s(t)$ are determined entirely by voltages and currents at the measuring point. In the above equations:

$\beta$ = damping factor, or decrement
$1/\alpha$ = phase velocity of waves on the line.

For the calculation of these defined instantaneous values for the various appraisal points, the computer 24 requires storage means providing for each appraisal point $x_i$ a corresponding storage delay time $T_i = 2\alpha x_i$ (assuming $x_o = 0$). That takes place in the store 22 with its various cells already referred to.

In the following discussion, it will accordingly be assumed that the transformation between $v(x_i, t)$ and $u(x_i, t)$ is in each case properly carried out and, according to the requirements of simplicity of presentation, the one or the other of these two values will be worked with. The generation of the function $v$ and its transformation to $u$ is carried out in the computer 24 by the use of known analog or digital computer components that are so well known as not to require further explanation here. See R. K. Richards, Arithmetic Operations in Digital Computers (1955) and N. R. Scott, Analog and Digital computer Technology (1960).

From the measured value pairs mentioned above, which are provided in sets of two pairs corresponding to an instantaneous value of the line voltage at a particular appraisal point, the computer 24 generates — continuously discontinuously in sequence — corresponding sequential values of a unimodal voltage function, for example a squared voltage function, and carries out a time averaging of this unimodal voltage function over a certain time range of sequential values.

Figure 2:
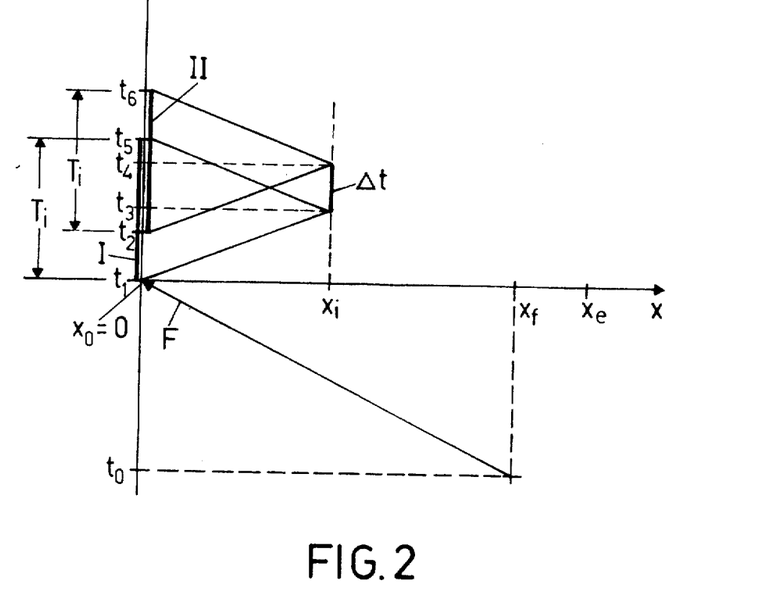
FIG. 2 is a graph giving a time-place diagram for representation of measurement and evaluation intervals over the length of a line for the apparatus of FIG. 1.

In FIG. 2 this mode of operation, up to this point, is graphically shown. Beginning with a short circuit at the time $t_o$ at the location $x_f$ on the line, a time interval $t_1$ is required before the monitoring operation can be brought into action in which the measuring means furnishes data from which calculations are quickly made to set off a failure signal. Then a first measured value determination I, defined in the previously mentioned sense, takes place over a time interval $T_i$ corresponding to twice the wave propagation time between $x_o = 0$ and $x_i$. This measurement comprises determination of the current and voltage value pairs found at the two instants $t_1$ and $t_5$ respectively, from which the computer 24 determines a corresponding instantaneous value of voltage at the appraisal point $x_i$ at the intermediate instant $t_3$ at exactly the middle of the aforesaid interval $T_s$. A further measurement II, with a time displacement $\Delta t$ with respect to the previously described measurement I likewise spans a time interval $T_s$ to determine the current-voltage value pairs for the instants $t_2$ and $t_6$. From these, the computer 24 calculates an instantaneous value of the voltage at the appraisal point $x_1$ for the instant $t_4$. The current voltage value pairs from the instants $t_1$ and $t_2$ are respectively stored until the instants $t_5$ and $t_6$, in order that they may be processed at the same time as the current-voltage value pairs are respectively present on a real-time basis at the instants $t_5$ and $t_6$. The instantaneous values of the voltages at $x_i$ for the instants $t_3$ and $t_4$ accordingly become available only at the instants $t_5$ and $t_6$ respectively.

From the instantaneous voltage values at $t_3$ and $t_4$, the computer 24 then generates a unimodal function, for example a squared voltage function, and then by time-averaging of the latter the desired evaluation function, the first value of which thus becomes available at the instant $t_4$. Further measurements, not shown in FIG. 2, then follow with corresponding values of the evaluation function.

Figure 3:
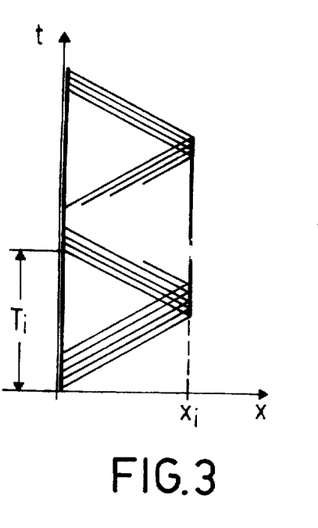
FIG. 3 is a modification of FIG. 2 for representation of a continuous mode of operation of the apparatus of FIG. 1.

The foregoing relations hold directly for the provision of a time-wise discontinuous sequence of measured values and the generation therefrom of values of the evaluation function. It is to be understood, however, that the same basic mode of operation holds both for a continuous measurement and storage and for a continuous generation of the evaluation function. Individual measurements in the above-defined sense do not actually appear externally in the latter case. Rather, as shown symbolically in FIG. 3, there is a continuous flow of measured values that are combined with current-voltage value pairs produced by corresponding storage to provide the time displacement $T_i$ and from the thus determined sets of value pairs, there are generated continuously or discontinuously (in the latter case with a step interval $\Delta t$ which is independent of the time displacement $T_i$) the values of the evaluation function.

Figure 4:
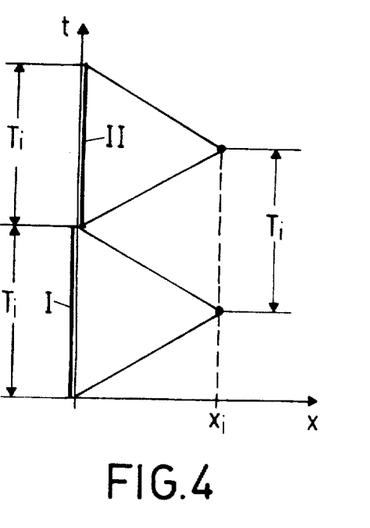
FIG. 4 is a modification of FIG. 2 for representation of a discontinous mode of operation for the apparatus of FIG. 1.

FIG. 4 shows a discontinuous sequence of measurement and generation of the evaluation function in which the step interval of the measurements is the same as the interval $T_i$ used in combining two members of a set of value pairs. The relationships in this case can be described by considering that the end of a first measurement I coincides with the beginning of a second measurement II.

Figure 5:
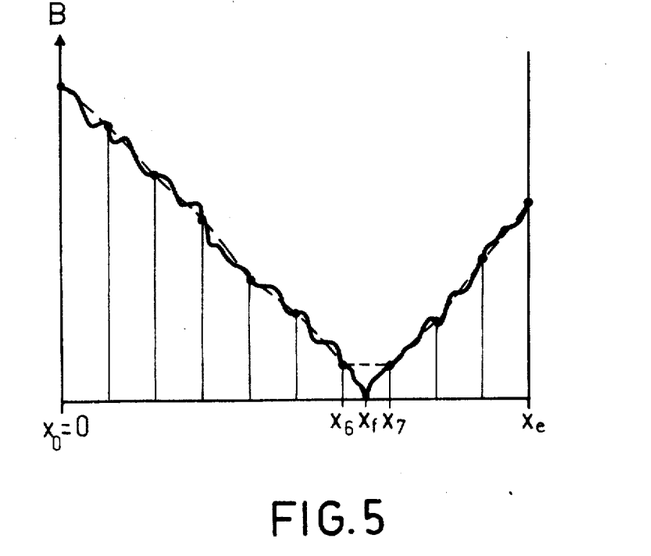
FIG. 5 is a graph showing the course of an evaluation function for a multiplicity of appraisal points distributed over the length of a line when a failure is present.

FIG. 5 shows the result of the generation of an evaluation function B for a large number of appraisal points in the case of a disturbance involving an ideal short circuit, i.e. the vanishing (reduction to zero) of the line voltage at the place of failure. The solid curve in FIG. 5 is a continuous curve of the evaluation function B calculated by simulation with very small steps in the form of the time average of a quadratic voltage function, which has its minimum at the place of failure $x_f$, i.e. between the appraisal point $x_6$ and $x_7$. The values of the evaluation function at the discrete appraisal points define the dashed curve, which still yields unambiguous localization of the failure between the appraisal points $x_6$ and $x_7$.

Figure 6:
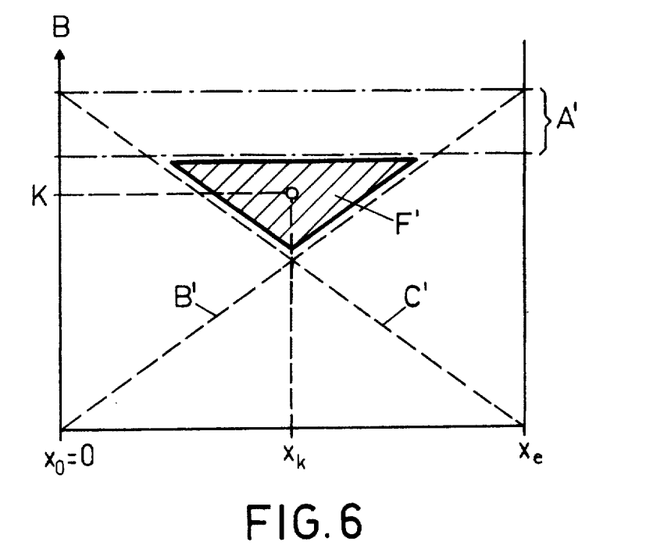
FIG. 6 is a diagram with the same scales as FIG. 5 for showing a limiting value region of the evaluation function usable as a failure signal criterion.

For the case of practical importance in which a localization of the place of failure only to one of a number of predetermined segments of a line is sufficient, the procedure illustrated in FIG. 6 with a single appraisal point $x_k$ on the line segment is sufficient. If for example it should be assumed that the line segment in question is fed symmetrically from both ends, the normal course of the evaluation function B can be assumed to be limited in a region A'. Furthermore, for the extreme cases of failure point positions at the line beginning and line end respectively, curves B' and C', which are shown here for simplicity as straight lines, describe the course of the evaluation function. Within the region F' designated by shading, thus, for example, for the previously mentioned appraisal point $x_k$, a fixed limit value K for the evaluation function can be established which is smaller than all values of the evaluation function within the region for normal operating conditions and greater than all values of the evaluation function for any possible failure point on the line. By comparison of the evaluation function for only a single appraisal point with such a limit value, it is thus possible to obtain immediately a criterion for determining the existence of a failure point at any position along the line segment under consideration. The appraisal point is appropriately selected at a place where the difference between the lower boundary of the normal operation values and the upward boundary of the fault disturbance region is greatest. In the case of symmetrical feed, therefore, such a place is more or less in the middle of the line segment.

The comparison of the evaluation function with one or more fixed limit values of the type above mentioned or a comparison of the evaluation functions of two or more appraisal points with each other for the purpose of testing for a minimum is carried out in the discriminator 100 shown in FIG. 1. For the corresponding selection and comparison operations, a multiplicity of conventional analog and digital circuits are available which require no further explanation in the present connection.

Figure 7:
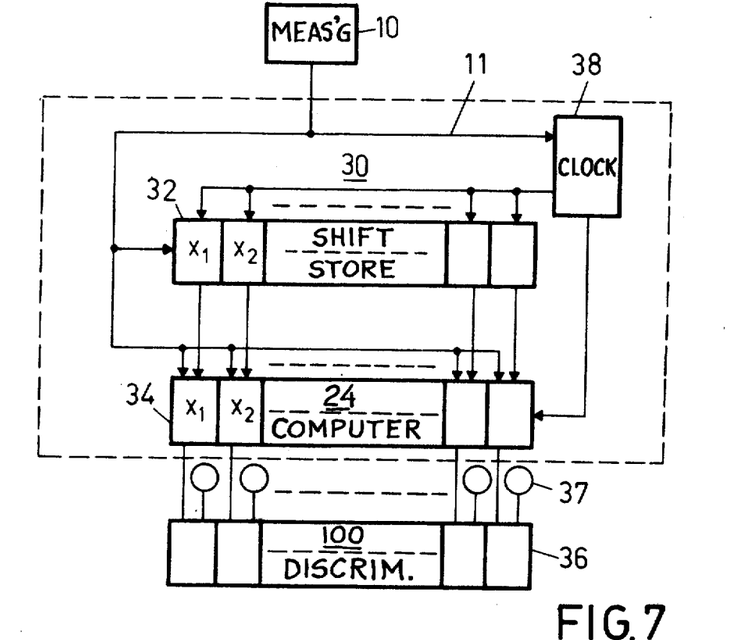
FIG. 7 is a block diagram showing the basic circuit of a modified form of apparatus for localizing failures in accordance with the invention.

FIG. 7 shows a circuit with the feature of utilizing a progressive type storage means 30 having stages 32 coupled to each other in sequence after the fashion of a shift register, the stages or cells 32 again corresponding to the appraisal points $x_1 \ldots x_l \ldots$. Each storage cell, further, is connected on its output side with the corresponding appraisal point computation unit 34 receives, in addition to the current-voltage value pair delayed by the wave propagation time corresponding to the position of the particular appraisal point, the current-voltage pair provided in real time (at the moment) by the measuring means 10, for the purpose of generating the evaluation function therefrom for each appraisal point. The timing of the advance (shift) of the progressive store 30 and the corresponding transfer of measured values to and through the appraisal point computing units 34 is controlled by a common clock pulse generator 38.

Figure 8:
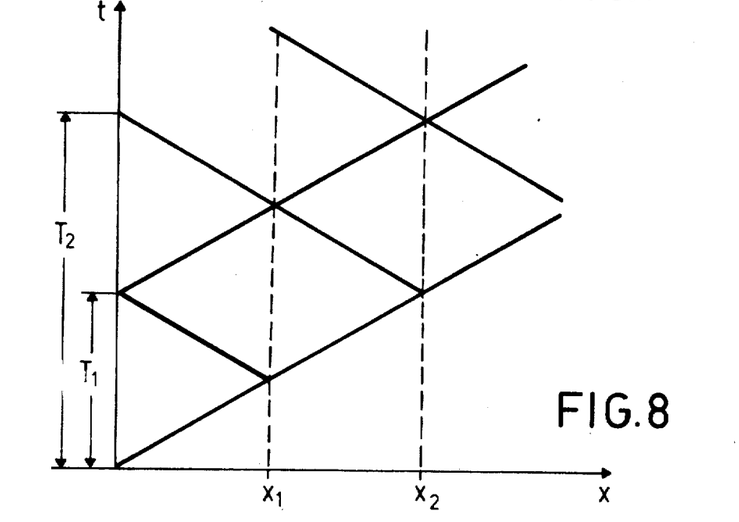
FIG. 8 is a time-place diagram similar to FIG. 2 for explaining the time-discontinuous mode of operation of the apparatus of FIG. 7.

In this illustrative circuit each appraisal point computing unit 34 is associated with a comparison unit 36 of the switching means 100 and a reference value provider 37. Thus for each appraisal point, a comparison with predetermined failure criteria can be carried out independently. The mode of operation of a circuit with a progressive store, as shown in FIG. 7, is illustrated in FIG. 8 for discontinuous measurements in equal time steps. This illustrates, in a diagram similar to FIG. 4, that from a single sequence of measured value pairs, combined in sets of two or any desired number of appraisal points in corresponding time steps, the corresponding momentary values of the line voltage can be calculated.

Figure 9:
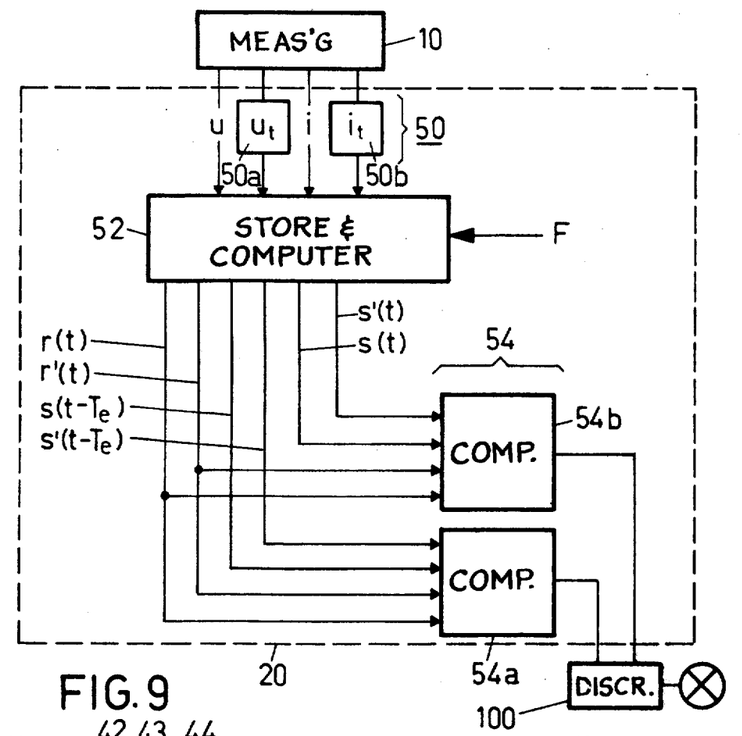
FIG. 9 is a block diagram showing the basic circuit of a further modification of a failure localizing apparatus in which the evaluation function is generated by the formation of a gradient.

The circuit of FIG. 9 operates with a squared voltage function as the evaluation function. The information processing means 20 connected to the measuring means 10 comprises a differentiating circuit 50 with individual circuits 50a and 50b for differentiating voltage and current respectively with respect to time and a computing and storage means 52. The latter generates, on the basis of the values supplied for voltage $u$, current $i$ and the corresponding first derivatives with respect to time, here denoted as $u_t$ and $i_t$, the auxiliary functions $r$ and $s$ in accordance with the equations (2) and (3) by which they were defined above, as well as additional auxiliary functions $r'$ and $s'$ defined as follows:

$$r'(t) = \tfrac{1}{2} \cdot (\alpha^2 i_{o_t}(t) + \beta i_o(t)) - \tfrac{1}{2} d\, u_{o_t}(t),$$
$$s'(t) = \tfrac{1}{2} \cdot (\alpha^2 i_{o_t}(t) + \beta i_o(t)) + \tfrac{1}{2} d\, u_{o_t}(t),$$

$r'$ relates to the actual (real) time $t$ and $s'$ to the time displaced in the past by the interval $T_i$. The information processor 20 also contains an additional computation circuit 54, consisting of two units 54a and 54b by which the unimodal voltage function $u^2$ is generated and also the time averages and the gradients. In the illustrated case it is assumed the beginning and end of the line segment are selected as appraisal points. The discrimination logic provided in the discriminator 100 accordingly carries out a sign test on the gradients. In the case of a negative gradient at the beginning of the line and a positive gradient at the end of the line, it can be concluded that there is a minimum within the line segment and therefore that there is a point of failure in that segment.

The mode of operation of the circuit just described follows basically from the following relation:

$$B = G(x) = \frac{dJ(x)}{dx} = \frac{1}{\Delta t} \int_o^{\Delta t} Mx(u(x,t))dt \qquad (6)$$

in which $M$ is a unimodal voltage function, $J$ a time-average function and $G$ the gradient of the time average of the unimodal voltage function, which gradient is here intended to serve as the evaluation function. In the particular case of a squared voltage function, there results as follows:

$$G(x) = \frac{2}{\Delta t} \int_o^{\Delta t} u(x,t) \cdot u_x(x,t)dt \qquad (7)$$

In the practical computation apparatus for this operation, the previously mentioned voltage function $v(x_i,t)$ is again introduced. For working out the equation (5) the spatial first derivative $v_x$ is then still necessary, and for it the following equation holds:

$$v_x(x_i,t) = r'(t) + e^{-\beta x_i / \alpha} \cdot s'(t + T_i) \qquad (8)$$

while $v$ itself is given by equation (1) previously set forth. Altogether it is therefore necessary for the circuit shown in FIG. 9 to provide the following input functions for the computation circuit 54:

$$r(t),\ r'(t),\ s(t - T_i),\ s'(t - T_i),\ s(t) \text{ and } s'(t).$$

These functions are generated in the storage and computer unit 52 by means of conventional computation components and circuits in accordance with the relationships mathematically set forth above.

Figure 10:
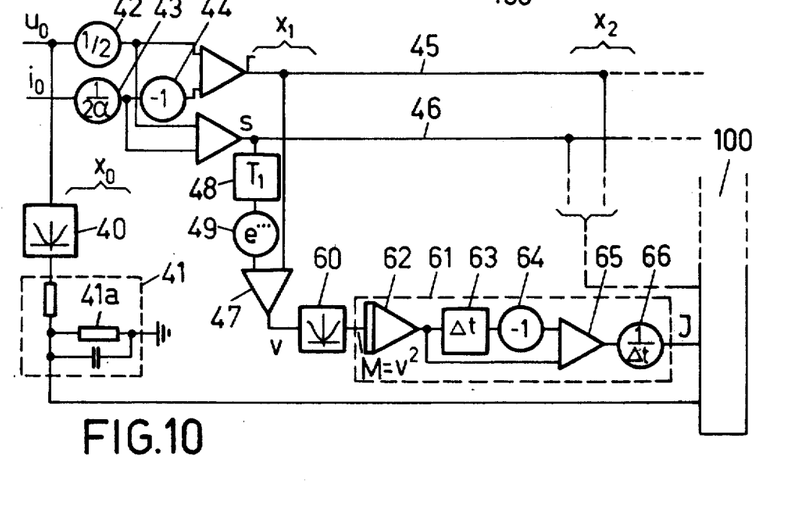
FIG. 10 is a circuit diagram of a portion of the apparatus according to the invention using components with an analog mode of operation for generating a multiplicity of values of an evaluation function or various locations over the line length.

FIG. 10 shows an analog computation circuit for providing time averages of a squared voltage function as an evaluation function for comparison with fixed limit values and doing so for a number of appraisal points $x_0, x_1, x_2...$ along the line, including the measuring point $x_0$ simultaneously as a first appraisal point. The computation arrangements relating to the time initial point $x_0$ regarded as an appraisal point comprise a squaring circuit 40, connected directly to the voltage output $u_o$ of the measuring means not shown in this figure, and having its output connected over a resistance-capacitance averaging circuit 41 comprising a proportional element in the form of a shunt resistor 41a. At the output of the averaging circuit 41, therefore, the desired evaluation function is directly obtained with an integration time determined by the aforesaid proportional element. The computation circuit for the appraisal point $x_1$ shown in FIG. 10 is representative of the computation circuits of all the remaining appraisal points. In the case of all these appraisal points not coinciding with the beginning end of the line, the input magnitudes $u_o$ and $i_o$ are respectively supplied to multipliers 42 and 43, the first of which multiplies by the factor ½ and the second by the factor ½α. The latter is followed by an inverter 44, so that the two products can be subtracted to form the auxiliary function $r$ and added to form the auxiliary function $s$ for the actual time $t$ in accordance with the equations (2) and (3) set forth above, and to furnish these auxiliary functions respectively on the conductors 45 and 46. Parallel channels branching off the conductors 45 and 46 are provided for each appraisal point for supplying signals in each case to a summing amplifier 47, which is supplied at one input with the function $r(t)$ obtained by a direct connection to the conductor 45 and is supplied with the signal corresponding to the second term of the right-hand side of equation (1), which is formed by passing the signal present on conductor 46 first through holding or delay circuit 48 having the delay time $T_i$ (in this particular case $T_1$) and then subjecting it to multiplication by the exponential factor $e^{-\beta x_i/\alpha}$ in the multiplier 49. The two additive terms which according to equation (1) form the quantity $v(x_i,t)$ are accordingly respectively present at the inputs of the summing amplifier 47, so that the output of the latter is the quantity $v$, which is then supplied to a squaring circuit 60 which generates the unimodal voltage function $M = v^2$ and then to an average value generator 61, which generates a corresponding time average $J$ which serves as an evaluation function having the integration time $\Delta t$. The term averaging circuit is used in a general way to describe a circuit that provides an intermediate value of the function from values of the function appearing during the integration time. The manner of operation for the computation circuit thus provided for a single appraisal point can be summarized by the following equations:

$$B_i = G(x_i) = \frac{\alpha J(x_i)}{\alpha x} = \frac{1}{\Delta t}\int_o^{\Delta t} M(x)\alpha t$$

$$= \frac{1}{\Delta t}\int_o^{\Delta t} \frac{\delta(v^2)}{\delta x}\alpha t = \frac{2}{\Delta t}\int_o^{\Delta t} v(x,t)\cdot v_x(x,t)\alpha t$$

The average value generator 61 in the illustrated case consists of an integration unit 62 continually summing the voltage function $M$ over the integration time, for example a Miller integrator, from the direct output signal of which there is continually subtracted the previous output signal displaced backwards in time by the integration time $\Delta t$. The delayed output magnitude is generated in a circuit branch containing a time delay element 63 followed by an inverter 64, so that the combination of the delayed and undelayed signals in the summing amplifier 65 will produce a subtraction, the result of which will then be divided by $\Delta t$ in a corresponding multiplier 66 to form a quotient at the output of the multiplier 66, which is the desired average value $J$. The comparison of the evaluation functions with the corresponding limit values is carried out in a discriminator 100, more or less as in the case of the discriminator of the system shown in FIG. 7.

Figure 11:
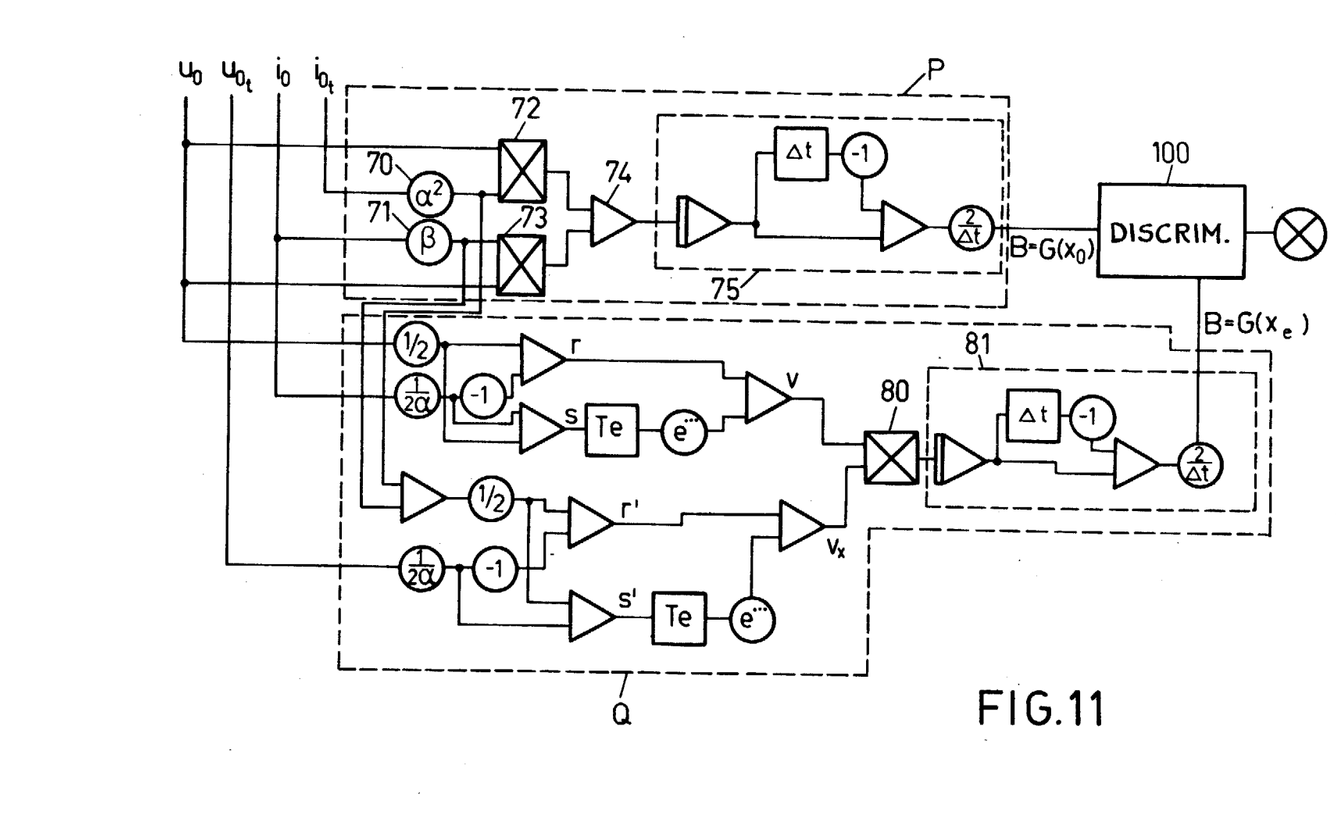
FIG. 11 is a circuit diagram of a portion of an apparatus according to the invention, likewise using analog mode components, for generating an evaluation function by the formation of a gradient.

FIG. 11 shows an analog circuit for operation in accordance with the system of FIG. 9 to form the gradients of an average value of a unimodal voltage function at both the beginning and end of a line segment, which will then serve as evaluation functions. The input magnitudes $u_o$ and $i_o$ and the corresponding time derivatives $\dot{u}_o$ and $\dot{i}_o$ are here assumed to have been formed by corresponding measuring and computation circuits ahead of the circuit shown in FIG. 11. The upper circuit portion P forms the gradient G $(x_o)$ as the evaluation function B at the beginning of the line, and the lower circuit portion Q forms the gradient G $(x_e)$ as the evaluation function B for the end of the line. The constitution and mode of operation of the circuit portion T are determined by the following equation for the gradient at the beginning of the line:

$$G(x_o) = \frac{2}{\Delta t}\int_o^{\Delta t} (\alpha^2 u_o(t)\cdot i_o{}'(t) + \beta u_o(t)\cdot i_o(t))\alpha t \qquad (9)$$

while for the circuit portion Q the more general equations (1) and (8) already given above, in combination with the equations (1) and (2) as well as (4) and (5) for the auxiliary functions $r,s,r'$ and $s'$ hold and provide for determination through equation (7) of the gradient for any desired appraisal point spaced at some distance from the beginning of the line, i.e. also for the line end $x_e$.

Accordingly, there are provided in the circuit portion P, in addition to the multipliers 70 and 71 respectively providing the constant factors $\alpha^2$ and $\beta$, the function multipliers 72 and 73 for the generation of the two additive terms in the integrand of equation (9). The summing of these two terms then takes place in an amplifier 74. The formation of the average value over the interval $\Delta t$ then takes place in an average value generator the constitution and operation of which corresponds to that of the circuit of 61 of FIG. 10, except for multiplication with a further factor 2 in the final multiplier, so that the circuit 75 needs no further explanation here. The last mentioned factor 2 comes from the equation (9) and is for reasons of technical convenience shifted to the average value generator 75, rather than inserted at an earlier stage.

The circuit portion Q comprises principally two circuit branches, of which the upper branch generates the auxiliary functions $r$ and $s$ in two parallel channels corresponding to the conductors 45 and 46 of FIG. 10, utilizing multipliers and amplifiers as in FIG. 10 to form the functions and to generate therefrom the voltage function $v$. The lower part of the circuit portion Q in a similar way generates the functions $r'$ and $s'$ in accordance with equations (4), (5) and (8) and then generates therefrom the spatial first derivative $v_x$ of the voltage function $v$. The functions $v$ and $v_x$ are then multiplied together in a function multiplier 80 to form the integrand in accordance with the equation (7) and this integrand is then supplied to an average value generator 81 for carrying out the integration and subsequent quotient formation for the integration period $\Delta t$. The average value generators 75 and 81 are identically constituted. At the output of the latter there accordingly appears the desired evaluation function for the far end of the line. Both evaluation functions are again supplied to a discriminator 100 which in this case carries out an opposed sign comparison for detection of the presence of a minimum of the evaluation function within the line segment being monitored.

Although the invention has been described with reference to particular illustrations and embodiments, it will be understood that variations and modifications may be made within the inventive concept.

Thus, the measuring means may be continuously in operation furnishing voltage and current voltage pairs, regardless whether the presence of a failure is suspected by other equipment, or it may be called into operation by equipment (not shown) designed to trip when a surge or transient arrives producing a change in current or voltage more rapid than a predetermined criterion. The latter type of operation was mentioned in connection with FIG. 2, where the progress along the line of the leading edge of a transient produced by a failure is indicated by the line F. In this case the operation of the equipment is to determine whether the disturbance is merely momentary, in which case the circuit may recover, or whether it is sufficiently persistent to warrant protective measures. On the other hand, the equipment can proceed with measurements whenever the line is in circuit, in order to be sure of catching a failure as early as possible.

The discriminator 100 that responds to the information processing means 20 can be of the type which provides the same response in every case of failure, or it may be of the type in which the response produced by its operation depends upon the particular appraisal points found to be closest to a failure location. Thus, the location of these appraisal points may be displayed on a visual display and the remote switching measures put into play may isolate and/or bypass only a part of the line segment instead of all of it.

I claim:

1. Method of localizing a failure on an electrical line in which current and voltage values are determined at a measuring point $(x_o)$ for monitoring at least one line segment and calculating therefrom conditions at at least one appraisal point $(x_i)$ on said line segment to determine the presence of a failure, comprising the steps of:
   a. carrying out a plurality of measured value determinations of the current and voltage concurrently present at the measuring point $(x_o)$ for each appraisal point $(x_i)$, each such measured value determination including at least one set of two pairs of current and voltage values concurrently observed at the measuring point $(x_o)$, each such set having a relative time displacement $(T_i)$ between the value pairs equal to twice the wave propagation time between the measuring point $(x_o)$ and the appraisal point $(x_i)$;
   b. storing the first concurrent value pair of each said set of value pairs, or a magnitude pair derived from said value pair, for at least the time interval $(T_i)$ corresponding to twice the wave propagation time;
   c. utilizing respective stored and just-measured value pairs determined at the measuring point $(x_o)$ to calculate the time-average, over a suitable integration time $(t)$, of a unimodal function of the voltage at the appraisal point $(x_i)$ to provide an evaluation function (B); and
   d. comparing said evaluation function (B) with at least one reference value to control the generation of a failure signal.

2. A method as defined in claim 1, in which a time sequence of measured value determinations, each consisting of a set of two pairs of current and voltage measurements relatively displaced in time by twice the said wave propagation time are made and from such sets of value pairs a time sequence of values of said evaluation function (B) is generated.

3. A method as defined in claim 2, in which the generation of a time sequence of values of said evaluation function (B) is initiated in response to the arrival at the measuring point of a transient disturbance (F, FIG. 2).

4. A method as defined in claim 2, in which the measured value determinations are made by detecting and storing continuously succeeding measured values.

5. A method as defined in claim 2, in which the measured value determinations and the generation of the evaluation function (B) is carried out at a sequence of discrete moments in time progression.

6. A method as defined in claim 2, in which a plurality of values, succeeding each other in time, of a unimodal function (M) of the voltage $(u)$ at at least one appraisal point $(x_i)$ is generated, said function having one and the same sign about the zero point of its argument, and in which then a time average of this unimodal voltage function (M) is generated to serve as an evaluation function and compared with at least one reference value.

7. A method as defined in claim 6, in which for a plurality of appraisal points on the monitored line segment at least one value of said evaluation function (B) is generated and in which then by mutual comparison of at least a portion of the values of said evaluation function (B) relating to the different appraisal points $(x_i)$ a test for a minimum is carried out, and in which, further, when a minimum is found for an appraisal point which is spaced from both the beginning and the end of the line segment being monitored, a failure signal is generated as an indication of the presence of a failure within the monitored line segment.

8. Method according to claim 7, in which a test for the presence of a relative minimum as an indication of a failure is carried out by comparing values of the evaluation function (B) corresponding to neighboring appraisal points.

9. Method as defined in claim 7, in which a test for the presence of an absolute minimum as an indication of failure is made by comparison of values of the evaluation function (B) corresponding to all of the predetermined appraisal points of the monitored line segment.

10. Method as defined in claim 6, in which for at least one appraisal point $(x_i)$ within the monitored line segment a comparison is made between at least one value of the evaluation function (B) and at least one predetermined limit value and a failure signal is produced when said evaluation function passes through said limit value.

11. Method as defined in claim 2, in which the evaluation function (B) is generated by calculating a time average of a gradient of a unimodal function (M) of a voltage ($u$) at at least one appraisal point on the monitored line segment, said unimodal function having one and the same sign about the zero point of its argument, and in which method, further, at least one value of this evaluation function (B) is compared with a reference value to provide a failure test.

12. Method as defined in claim 11, in which for at least two neighboring appraisal points a plurality of values successive in time of said unimodal voltage function (M) is generated and for every appraisal point a time average (J) of this unimodal voltage function (M) is generated and by combination of this time average value (J) relating to neighboring appraisal points a gradient (G) is generated as the said evaluation function (B).

13. A method as defined in claim 11, in which for at least one appraisal point, which may be an intermediate point or either end point of the monitored line, at least one value of the gradient (G) generated as an evaluation function (B) is compared with at least one predetermined limit value, and in which when said gradient (G) falls below said limit value a failure signal is produced.

14. A method as defined in claim 11, in which for at least two appraisal points which are located in the region of the beginning and of the end of the monitored line segment the sign of a gradient is determined and that the gradient signs of the two appraisal points are subjected to an inequality test to provide a failure signal when they are unequal.

15. Apparatus for detecting failures on an electrical line located at measuring point on said line to monitor at least one segment of said line, comprising:
a. measuring means (10) connected to said line at said measuring point ($x_o$) for determining the values of timeconcurrent voltage and current value pairs in time sequence;
b. information processing means (20) having as input the values of said value pairs supplied by said measuring means and including
  i. information storage means for storing, for each of one or more predetermined appraisal points ($x_i$) on said line segment, for a time ($T_i$) equal to at least twice the wave propagation time over said line segment between the measuring point ($x_o$) and the particular one of said appraisal points ($x_i$) voltage and current value pairs determined by said measuring means or magnitudes derived from said value pairs, and
  ii. computing means for combining with each other current and voltage value pairs mutually time-displaced by twice the said wave propagation time, for computing for each appraisal point ($x_i$) in accordance with the characteristic line equations and by use of at least one time averaging operation, an evaluation function (B) of the voltage at the appraisal point ($x_i$) dependent on a time sequence of sets of two time-displaced value pairs combined as aforesaid;
c. discriminator means (100) responsive to said information processing means (20) for comparing said evaluation function for at least one appraisal point with at least one reference value and controlling by the result of such comparison means for reacting to a failure on said line segment.

16. Apparatus as defined in claim 15, in which said storage means comprises a plurality of cells each corresponding to an appraisal point and in which storage means value pairs determined by said measuring means are progressively shifted from one cell to the next in fixed succession, in which said appraisal points are distributed over said line segment with equal increments of wave propagation period along the line between them, and in which the progression of value pairs from one cell of said storage means to the next is at intervals equal to twice the value of said equal increments of wave propagation period, and in which said apparatus includes clock pulse generating means (38) for timing the progression of said value pairs in said storage means as aforesaid.

17. Apparatus as defined in claim 15 in which said information processing means and its storage and computing means comprise line simulation circuitry being equivalent to said line segment to the extent needed to determine the line voltage ($u(x_i, t)$) in each of a set of predetermined appraisal points ($x_i$) or a magnitude dependent on the magnitude of said line voltage, and include also, in addition to said simulation circuitry, means for generating a time average (J) from said unimodal voltage function to serve as said evaluation function (B).

18. Apparatus as defined in claim 15 in which said information processing means (20) includes computing means (50,52,54) for generating the spatial first derivative ($M_x$) of a unimodal voltage function (M) of the line voltage ($u$) with respect to the line length ($x$) at each appraisal point ($x_i$) in such a way as to provide an output corresponding to a time-average (J) of said first derivative ($M_x$) for use as said evaluation function (B).

19. Apparatus as defined in claim 18 in which one of said appraisal points, coinciding with said measuring point ($x_o$), is located at the beginning of said line segment.

20. Apparatus as defined in claim 19 in which one of said appraisal points is located at the end of said line segment ($x_e$) opposite from the end to which said measuring point is connected.

21. Apparatus as defined in claim 18 in which there is generated, as the output of said information processing means and hence as an evaluation function, the gradient of the time average of a quadratic function of the voltage ($u$) at the appraisal point ($x_i$).

22. Apparatus as defined in claim 18, in which said measuring means is constituted as means for continuously measuring current and voltage on said line segment at said measuring point, and in which said information processing means includes differentiating means for generating the first derivative with respect to time of the current and voltage so measured.

23. Apparatus as defined in claim 18, in which said discriminator means is arranged to compare the signs of the evaluation functions for the respective appraisal points.

24. Apparatus as defined in claim 23, in which the appraisal points are the ends of the line segment, one of which is also the measuring point, and in which said discriminator means is arranged to activate said means for reacting to a failure when the respective signs of said evaluation functions are opposite and indicate a voltage minimum between the ends of the line segment.

25. Apparatus as defined in claim 15, in which said information processing means (20) includes, for computation regarding each appraisal point ($x_i$), at least one parallel circuit of two information processing channels of which one is substantially free of delay and the other includes delay-producing means with a delay time of substantially twice the aforesaid wave propagation period ($T_i$).

26. Apparatus as defined in claim 25, in which said delay-producing means is in the form of a quantizing transfer-and-hold circuit with a holding time ($T_i$) corresponding to twice the aforesaid wave propagation period.

* * * * *